US009236888B2

(12) United States Patent
Yamazaki et al.

(10) Patent No.: US 9,236,888 B2
(45) Date of Patent: Jan. 12, 2016

(54) STORAGE DEVICE, MEMORY CONTROLLER AND MEMORY CONTROL METHOD

(71) Applicant: Kabushiki Kaisha Toshiba, Minato-ku (JP)

(72) Inventors: Susumu Yamazaki, Yokohama (JP); Kenji Yoshida, Kamakura (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 50 days.

(21) Appl. No.: 14/306,462

(22) Filed: Jun. 17, 2014

(65) Prior Publication Data
US 2015/0256203 A1 Sep. 10, 2015

Related U.S. Application Data

(60) Provisional application No. 61/950,625, filed on Mar. 10, 2014.

(51) Int. Cl.
*H03M 13/00* (2006.01)
*H03M 13/29* (2006.01)
*G06F 11/10* (2006.01)
*G11C 16/26* (2006.01)
*G11C 11/56* (2006.01)

(52) U.S. Cl.
CPC .......... *H03M 13/29* (2013.01); *G06F 11/1068* (2013.01); *G11C 11/5642* (2013.01); *G11C 16/26* (2013.01)

(58) Field of Classification Search
CPC ............ G06F 11/1048; G06F 11/1068; G06F 11/1072; G06F 11/16; G11C 11/5642; G11C 16/26; H03M 13/29; H03M 13/2927
See application file for complete search history.

(56) References Cited

U.S. PATENT DOCUMENTS

| 8,116,134 | B2 | 2/2012 | Shibata et al. |
| 8,331,147 | B2 | 12/2012 | Shiga |
| 8,385,117 | B2 | 2/2013 | Sakurada et al. |
| 8,689,082 | B2 * | 4/2014 | Oh ..................... G11C 11/5628 |
| | | | 714/764 |
| 8,984,375 | B2 * | 3/2015 | Hashimoto ........... G06F 11/004 |
| | | | 714/47.2 |
| 9,047,210 | B2 * | 6/2015 | D'Abreu ............. G06F 11/1048 |
| 2014/0229131 | A1 * | 8/2014 | Cohen et al. ....... G11C 16/0483 |
| | | | 6/483 |

FOREIGN PATENT DOCUMENTS

| JP | 2009-158061 | 7/2009 |
| JP | 2011-044200 | 3/2011 |
| JP | 2012-181761 | 9/2012 |

* cited by examiner

*Primary Examiner* — Christine Tu
(74) *Attorney, Agent, or Firm* — Oblon, McClelland, Maier & Neustadt, L.L.P.

(57) ABSTRACT

According to an embodiment, a storage device includes: a semiconductor memory that includes a multilevel memory cell, stores a first code word and a second code word, and in which a plurality of memory cells connected to one word line can store a plurality of pages; and a controller. The controller performs error correction processing of the first code word read out from one page among the plurality of pages of the semiconductor memory, and the second code word written in a page other than the page corresponding to the first code word among the plurality of pages, re-reads the first code word when the first code word is uncorrectable and the second code word was able to be corrected by the error correction processing, and determines a bit value of the first code word using a re-read result and the second code word after error correction.

18 Claims, 9 Drawing Sheets

| Thresh | ER | A | B | C | D | E | F | G |
|---|---|---|---|---|---|---|---|---|
| Upper | 1 | 1 | 1 | 0 | 0 | 0 | 0 | 1 |
| Middle | 1 | 1 | 0 | 0 | 1 | 1 | 0 | 0 |
| Lower | 1 | 0 | 0 | 0 | 0 | 1 | 1 | 1 |

| | | | | | | | |
|---|---|---|---|---|---|---|---|
| Upper | USER DATA (1KB) | PARITY | USER DATA (1KB) | PARITY | ...... | USER DATA (1KB) | PARITY |
| Middle | USER DATA (1KB) | PARITY | USER DATA (1KB) | PARITY | ...... | USER DATA (1KB) | PARITY |
| Lower | USER DATA (1KB) | PARITY | USER DATA (1KB) | PARITY | ...... | USER DATA (1KB) | PARITY |

FIG.5

| Thresh | ER | A | B | C | D | E | F | G |
|---|---|---|---|---|---|---|---|---|
| Upper | 1 | 1 | 1 | 0 | 0 | 0 | 0 | 1 |
| Middle | 1->0 | 1->0 | 0 | 0 | 1 | 1 | 0->1 | 0->1 |
| Lower | 1 | 0 | 0 | 0 | 0 | 1 | 1 | 1 |

FIG.7

NORMAL PAGE
(U/L) DATA

Upper | 0 0 0 1 1 0 1 ...
Lower | 0 1 0 1 0 0 0 ...

M PAGE
ESTIMATION DATA

U/L
0/0
0/1
1/0
1/1

STORAGE DEVICE, MEMORY CONTROLLER AND MEMORY CONTROL METHOD

CROSS-REFERENCE TO RELATED APPLICATIONS

This application is based upon and claims the benefit of priority from U.S. Provisional Application No. 61/950,625, filed on Mar. 10, 2014; the entire contents of which are incorporated herein by reference.

FIELD

Embodiments relates to a storage device, a memory controller, and a memory control method.

BACKGROUND

In a NAND flash memory (hereinafter, referred to as a NAND memory), information is stored by a charge amount accumulated in a floating gate of a memory cell. A threshold voltage is determined according to the charge amount accumulated in a floating gate of a memory cell. The threshold voltage indicates a voltage with which a transistor of the memory cell is turned ON (the voltage with which a current begins to flow). That is, when a voltage equal to or more than the threshold voltage is applied to the memory cell, the current flows, and when a voltage less than the threshold voltage is applied, the current does not flow. In the NAND memory, a plurality of ranges of the threshold is defined, each range is allocated to a plurality of data values, and electrons are poured such that the threshold of the memory cell falls within a range corresponding to a data value. This enables each memory cell to store the data value.

For example, a memory cell of 3 bits/cell, which is capable of storing 3 bits per memory cell is used, eight voltage ranges are allocated to eight data values. At the time of write-in, the electrons are poured such that the charge amount accumulated in the floating gate of the memory cell becomes a charge amount corresponding to any one of the eight voltage ranges. Then, seven read out voltages for distinguishing the eight voltage ranges are applied, so that the data values stored in the memory cell can be read. Meanwhile, in the NAND memory, the charge amount in the floating gate may sometimes be changed from the time of write-in, and thus the data values stored in the memory cell may not be able to be read out correctly.

BRIEF DESCRIPTION OF THE DRAWINGS

FIG. 5 is a diagram illustrating an example of change of thresholds, determination errors of bit values, and values after re-read.

FIG. 7 is a diagram schematically illustrating a method of selecting estimation data;

DETAILED DESCRIPTION

In general, according to one embodiment, a storage device of the present embodiment includes: a semiconductor memory that stores a first code word and a second code word, and includes a multilevel cell, a plurality of memory cells connected to one word line being capable of storing a plurality of pages; and a controller that reads out the first code word from one page of the plurality of pages of the semiconductor memory, and the second code word written in a page other than the page corresponding to the first code word of the plurality of pages. The controller performs error correction processing using the first and the second code word read out from the semiconductor memory, re-reads the first code word when the first code word is uncorrectable and the second code word has been able to be corrected by the error correction processing, and determines each bit value of the first code word using a read-out result by the re-reading and a bit value of each bit of the second code word after error correction.

Hereinafter, a storage device, a memory controller, and a memory control method according to embodiments will be described in detail with reference to the appended drawings. Note that the present invention is not limited by these embodiments.

First Embodiment

Figure 1:
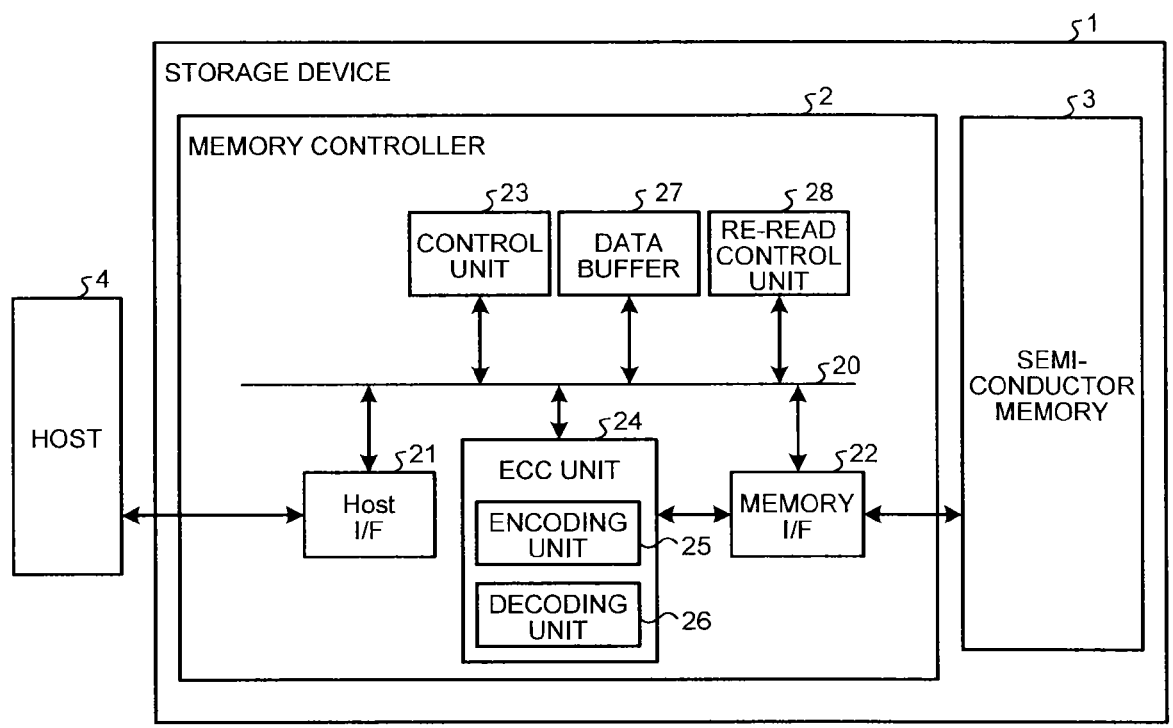
FIG. 1 is a block diagram illustrating a configuration example of a storage device according to a first embodiment.

FIG. 1 is a block diagram illustrating a configuration example of a storage device according to a first embodiment. A storage device 1 of the present embodiment includes a memory controller 2 and a semiconductor memory 3. The storage device 1 can be connected with a host 4, and FIG. 1 illustrates a state in which the storage device 1 is connected with the host 4. The host 4 is an electronic device, such as a personal computer or a mobile terminal.

The semiconductor memory 3 is a semiconductor memory that stores data in a non-volatile manner, and is, for example, a NAND memory. In the NAND memory, write-in and read out of data is performed for each write-in unit data, typically called page. In the present embodiment, a memory cell of the semiconductor memory 3 is a multilevel cell capable of storing 2 bits or more in a single memory cell.

The memory controller 2 controls write-in to the semiconductor memory 3 according to a write-in command from the host 4. Further, the memory controller 2 controls read out from the semiconductor memory 3 according to a read out command from the host 4. The memory controller 2 includes a host I/F 21, a memory I/F 22 (memory control unit), a control unit 23, an error correcting code (ECC) unit 24, a data buffer 27, and a re-read control unit 28, and these units are mutually connected by an internal bus 20.

The host I/F 21 outputs a command, user data (write-in data) received from the host 4, and the like to the internal bus 20. Further, the host I/F 21 transmits user data (read out data) read out from the semiconductor memory 3, a response from the control unit 23, and the like to the host 4.

The memory I/F 22 controls processing of writing of the user data and the like to the semiconductor memory 3, and processing of reading out the user data, and the like from the semiconductor memory 3, based on an instruction from the control unit 23.

The control unit 23 comprehensively controls the storage device 1. The control unit 23 may be, for example, a central processing unit (CPU), a micro processing unit (MPU), or the like. When having received a command from the host 4 through the host I/F 21, the control unit 23 performs control according to the command. For example, the control unit 23 instructs the memory I/F 22 to write user data and parity in the semiconductor memory 3 according to a command from the host 4. Further, the control unit 23 instructs the memory I/F 22 to read out the user data and the parity from the semiconductor memory 3 according to a command from the host 4.

The control unit 23 determines a storage area (memory area) on the semiconductor memory 3 with respect to the user data accumulated in the data buffer 27. The user data is stored in the data buffer 27 through the internal bus 20. The control unit 23 conducts determination of the memory area with respect to data of a page unit (page data) that is a write-in unit. In the present embodiment, memory cells commonly connected to one word line are defined as a memory cell group. When the memory cell is a multilevel cell, the memory cell group corresponds to a plurality of pages. For example, when a multilevel cell (of 2 bits/cell) capable of storing 2 bits is used, the memory cell group corresponds to two pages. When a multilevel cell (of 3 bits/cell) capable of storing 3 bits is used, the memory cell group corresponds to three pages.

Figure 2:
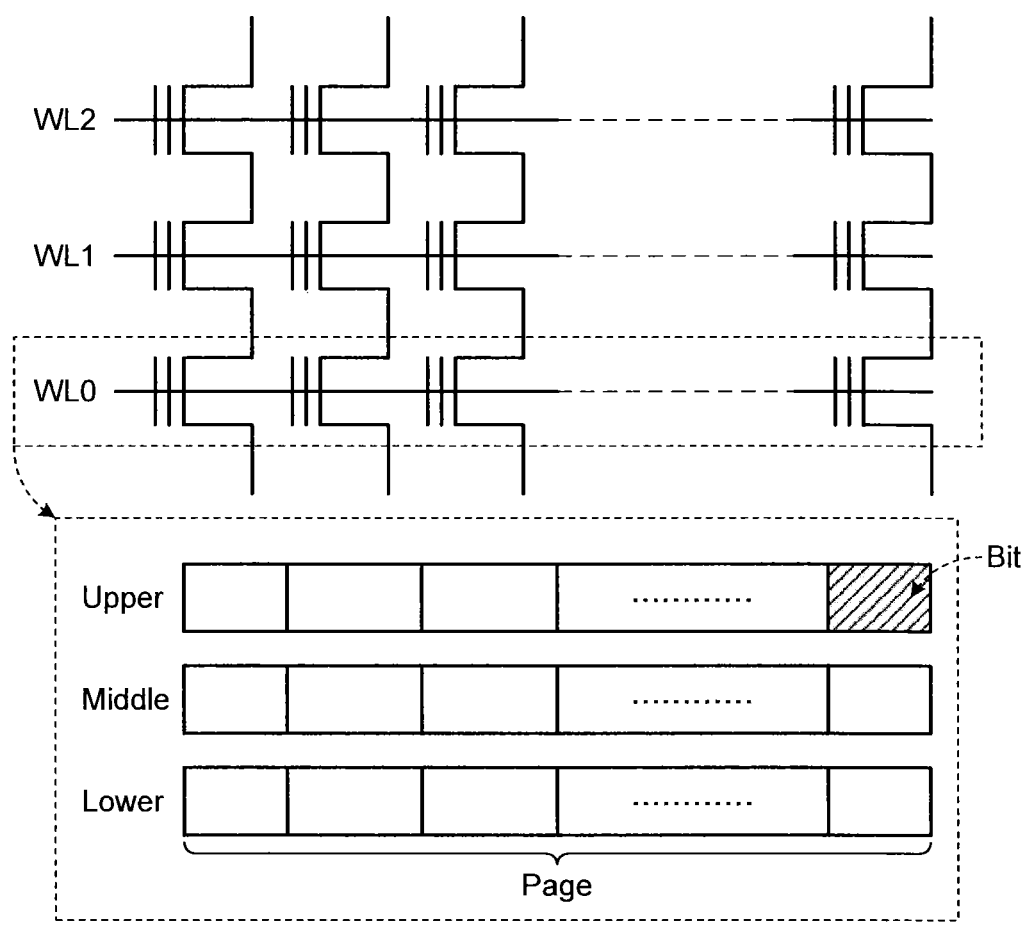
FIG. 2 is a diagram illustrating a relationship between a memory cell and pages of when a memory cell of 3 bits/cell is used.

FIG. 2 is a diagram illustrating a relationship between a memory cell and pages of when a memory cell of 3 bits/cell is used. In the present embodiment, when the memory cell of 3 bits/cell is used, 3 bits stored in one memory cell are respectively called upper bit, middle bit, and lower bit. Further, a page configured from an upper bit of a memory cell that configures one memory cell group (a memory cell connected to one word line (WL)) is called upper page, a page configured from a middle bit is called middle page, and a page configured from a lower bit is called lower page.

The control unit 23 determines a memory area of the semiconductor memory 3 of a write-in destination, for each page. A physical address is allocated to the memory area of the semiconductor memory 3. The control unit 23 manages the memory area of the write-in destination of the user data using the physical address. The control unit 23 specifies the determined memory area (physical address) and instructs the memory I/F 22 to write the user data in the semiconductor memory 3. The control unit 23 manages correspondence between a logical address (a logical address managed by the host 4) and the physical address of the user data. When having received a read-out command including the logical address from the host 4, the control unit 23 identifies the physical address corresponding to the received logical address, and instructs the memory I/F 22 to read out the user data from the identified physical address.

The ECC unit 24 includes an encoding unit 25 and a decoding unit 26. The encoding unit 25 encodes the user data having a predetermined size written in the same page to generate parity. The parity is written in the page in which the user data that is the base of the encoding has been written. The decoding unit 26 performs decoding using the parity. Details of the encoding and decoding of the present embodiment will be described below.

The data buffer 27 temporarily stores the user data received from the host 4 until storing the data in the semiconductor memory 3, and temporarily stores the data read out from the semiconductor memory 3 until transmitting the data to the host 4. The data buffer 27 is configured from a general-purpose memory, such as a static random access memory (SRAM) or a dynamic random access memory (DRAM).

The re-read control unit 28 controls conducting of re-read when there is error uncorrectable user data, based on a decoding result of the decoding unit 26, at the time of read-out from the semiconductor memory 3. In this re-read, re-read is conducted based on a data value of another page in the memory cell group in which the error uncorrectable user data is stored. Details of the re-read of the present embodiment will be described below. The re-read control unit 28 may be implemented by hardware, or may be implemented as firmware executed by a CPU or an MPU as the control unit 23 or may be implemented as firmware executed by a CPU or an MPU different from the control unit 23.

In FIG. 1, a configuration example in which the memory controller 2 includes each of the ECC unit 24 and the memory I/F 22 has been described. However, the ECC unit 24 may be built in the memory I/F 22. Further, the re-read control unit 28 may be built in the memory I/F 22.

Figures 3, 4:
FIG. 3 is a diagram illustrating voltage ranges and an example of data allocation in a multilevel cell of 3 bits/cell.
FIG. 4 is a diagram illustrating an example of user data and parity stored in each page of a semiconductor memory.

Next, storage and read out of data in the semiconductor memory 3 of a multilevel cell will be described. Hereinafter, an example of using a memory cell of 3 bits/cell as a memory cell of the semiconductor memory 3 will be described. FIG. 3 is a diagram illustrating an example of voltage ranges and data allocation in a multilevel cell of 3 bits/cell. A horizontal axis direction of FIG. 3 represents a threshold voltage (a voltage based on a charge amount). A vertical axis of eight distributions (threshold distributions) illustrated in an upper section of FIG. 3 represents a frequency (the number of memory cells). Variation is caused in the threshold for each memory cell. Here, eight ranges of the threshold are called eight levels. To be specific, as illustrated in the top row of the table at the lower section of the threshold distributions of FIG. 3, the eight levels are called level ER, level A, level B, level C, level D, level E, level F, and level G.

At the time of write-in of data to the semiconductor memory 3, the electrons are poured such that the number of electrons of a floating gate (the charge amount) falls within one of the eight types of levels (eight ranges) according to a data value. The eight types of levels are respectively allocated to three-bit data values. In FIG. 3, a data value "111" (the upper bit, the middle bit, and the lower bit are "1", "1", and "1", respectively) is allocated to the level ER. Further, data values of "110", "100", "000", "010", "011", "001", and "101" are respectively allocated to the level A, level B, level C, level D, level E, level F, and level G. Seven voltages that serve as boundary lines for dividing the eight ranges are called hereinafter read out voltages.

When the allocation of the data values illustrated in FIG. 3 is used, to perform read-out of an upper bit from a memory cell, that is, to perform determination of whether the upper bit is 0 or 1, the read out may just be performed with the read out voltages indicated by the thick vertical lines in the row of Upper in the table of FIG. 3. For example, two voltages of a read out voltage VU1 at the boundary line between the level B and the level C and a read out voltage VU2 at the boundary line between the level F and the level G are applied to the memory cell. Then, when a current flows when the VU1 is applied (when the threshold of the memory cell is the VU1 or less), the upper bit can be determined to be "1". Further, when a current flow when the VU2 is applied, but when a current does not flow when the VU1 is applied (the threshold of the memory cell is larger than the VU1 and equal to or less than the VU2), the upper bit can be determined to be "0". Further, when a current does not flow if the VU2 is applied (when the threshold of the memory cell is larger than the VU2), the upper bit can be determined to be "1".

Similarly, regarding the middle bit and the lower bit, by applying the read out voltages indicated by the thick lines in the table of FIG. 3 to the memory cell, the stored bit values can be determined, that is, the bit values can be read out. Note that the allocation of the data values of FIG. 3 is an example, and the allocation of the data values to respective levels is not limited to the example of FIG. 3.

As described above, in the example of FIG. 3, when a bit value of any of the upper, middle, and lower bits is read out, the bit value can be determined using only a part of the read out voltages of the eight read out voltages. However, the thresholds of the memory cell may be changed after write-in is performed until read-out is performed. If the thresholds are changed, a bit value is determined to be a wrong value when the bit value is determined using the read out voltages, and a read-out error may occur.

Meanwhile, the user data stored in the semiconductor memory 3 has been subjected to error correction encoding. The encoding unit 25 applies the error correction encoding to the user data having a predetermined size (for example, 1 KB) to generate parity. FIG. 4 illustrates an example of the user data and the parity stored in each page of the semiconductor memory 3. FIG. 4 illustrates an example of applying the error correction encoding to the user data to generate the parity. FIG. 4 illustrates an example in which a plurality of sets (code words) of the user data having a predetermined size and the parity corresponding to the user data is stored in one page. FIG. 4 is an example, and the number of the sets of the user data and the corresponding parity stored in one page may be any number as long as the number is 1 or more. In the present embodiment, the set (code word) of the user data having a predetermined size and the corresponding parity is called ECC group.

As described above, the parity is added to the user data, and the user data and the parity are stored in the semiconductor memory 3. At the time of read-out, the user data and the parity are read out, and the decoding unit 26 performs the error correction of the user data using the parity. Therefore, when there is the number of errors in the user data read out from the semiconductor memory 3, the number being equal to or less than the number of errors that can be corrected using the parity added to the user data, the errors are corrected and a correct data value can be obtained.

There may be a case in which an error that cannot be corrected remains in any of the upper, middle, and lower pages corresponding to the same memory cell group, and the other pages succeed in the error correction. As exemplarily illustrated in FIG. 3, data values of the upper, middle, and lower bits are allocated to the level of the threshold, and thus the data values of the upper, middle, and lower bits are not mutually dependent values, and have a certain relationship. Therefore, in the present embodiment, a range that can be taken by the data value in the page, which was not be able to be corrected, is narrowed down using a data value after the error correction of a page that has succeeded in the error correction (candidates of an original range (level) of the data value are obtained). Then, by re-reading the page that was not be able to be corrected using a narrowed result, a possibility of correcting the page that was not be able to be corrected is enhanced.

As an example, assume that a given ECC group stored in a middle page is decoded by the decoding unit 26 at the time of read-out, and the given ECC group was error uncorrectable. In this case, assume that an ECC group of an upper page corresponding to the memory cell corresponding to the given ECC group, and an ECC group of a lower page corresponding to the memory cell corresponding to the given ECC group succeed in the error correction by the decoding unit 26. Further, assume that the data value allocation of FIG. 3 has been performed. Assume that the upper bit of one memory cell corresponding to the given ECC group after the error correction is "0", and the lower bit is "0". In this case, this memory cell corresponds to the level C or the level D. Therefore, the data value of the middle bit can be determined by reading out (re-reading) of the data value with the read out voltage at the boundary line between the level C and the level D.

FIG. 5 is a diagram illustrating an example of change of the thresholds, determination errors of bit values, and values after re-read. For example, assume that the threshold of the memory cell has been changed to the position of the level A when the threshold was originally the level C. In this case, this memory cell is determined to be the threshold of equal to or less than the read out voltage of the boundary line between the level A and the level B in normal read-out of the middle bit, and thus the bit value of the middle bit is determined to be "1". Meanwhile, like the present embodiment, when the middle bit is read out with the read out voltage at the boundary line between the level C and the level D based on values of the upper bit and the lower bit after the error correction, the bit value of the middle bit can be read out as the correct value of "0". 1→0 of the middle bit of the level A of FIG. 5 indicates that the middle bit is determined to be "1" in normal read out when the memory cell that was originally the level C has been changed to the level A, but the middle bit is determined to be "0" in the re-read of the present embodiment. Note that, when the memory cell that was the level C at the time of write-in has been changed to the state of the level A, there is a possibility that wrong bit values may be read out for the upper bit and the lower bit. However, these errors have been corrected to correct values by the above-described error correction by the decoding unit 26.

Similarly, when the memory cell that was the level C at the time of write-in has been changed to the state of the level ER, or when the memory cell that was the level D at the time of write-in has been changed to the level F or the level G, the bit values of the middle bit can be read out as correct values by reading out the middle bit with the read out voltage at the boundary line between the level C and the level D in a similar manner.

Figure 6:
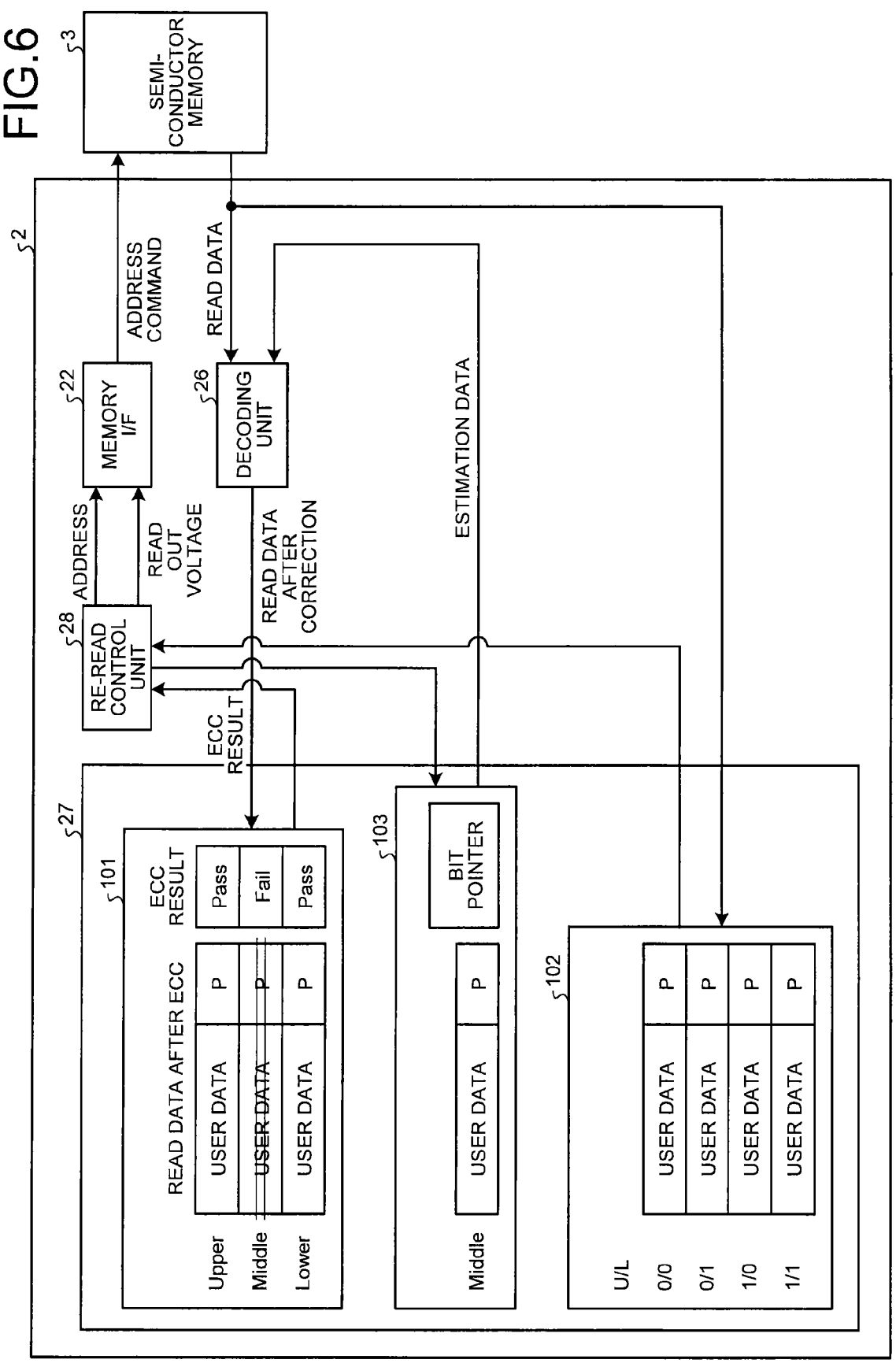
FIG. 6 is a diagram illustrating transmission/reception of data regarding re-read control in the storage device of the first embodiment.

FIG. 6 is a diagram illustrating transmission/reception of data regarding re-read control in the storage device 1 of the present embodiment. In normal read out, read-out of the user data and the parity is performed in page units. Then, the read user data and parity are input to the decoding unit 26. When there is an error uncorrectable ECC group by the error correction processing of the decoding unit 26, the re-read control unit 28 instructs the memory I/F 22 to read out a page that has not been read out, from among the three pages of the memory cell group in which the ECC group is stored. To be specific, the re-read control unit 28 specifies an address of the page to be read out, and instructs the memory I/F 22 to perform read out. In the example of FIG. 6, an error of the ECC group stored in the middle page was uncorrectable. An ECC result data 101 of FIG. 6 includes the user data and the parity after the error correction processing of the decoding unit 26, and information indicating whether the error correction of the user data and the parity has been succeeded. The ECC result data 101 is stored in the data buffer 27. Note that the storage place of the ECC result data 101 is not limited to the data buffer 27, and a memory different from the data buffer 27 is provided and the ECC result data 101 may be stored in the memory.

The memory I/F 22 reads out the user data and the parity (read data) from the semiconductor memory 3 based on an instruction from the re-read control unit 28. The read out user data and parity are input to the decoding unit 26. The decoding unit 26 applies the error correction processing to the user data and the parity read out from the semiconductor memory 3 (read data read out from the upper page and the lower page, in the example of FIG. 6), and stores read data after the error correction in the data buffer 27 as the ECC result data 101. FIG. 6 illustrates, regarding the upper page and the lower page, an example in which correction of ECC groups corresponding to the ECC group that was error uncorrectable in the middle page has been succeeded. Note that, in normal read out, the data read out from the semiconductor memory 3 is read out in page units, and thus all of read data of each page is stored in the data buffer 27. However, in read out in the re-read control, only the ECC group to be used for re-read of each page may be stored in the data buffer 27. In FIG. 6, for simplification of the drawing, only the ECC group to be used for re-read is illustrated as the ECC result data 101.

The re-read control unit 28 determines a read out voltage based on the bit values of the upper bit and the lower bit for each memory cell (that is, for each bit), regarding the ECC group that was error uncorrectable in the middle page based on the ECC result data 101. The re-read control unit 28 then specifies the determined read out voltage, and instructs the memory I/F 22 to read out the middle page in which the ECC group that was error uncorrectable is stored. Note that, while the ECC group is stored in a plurality of memory cells, the read out voltage is determined for each memory cell. Therefore, typically, a plurality of the read out voltages is instructed to the memory I/F 22.

The memory I/F 22 reads out the middle page with the read out voltage specified by the re-read control unit 28. The read out read data (re-read data) is not input to the decoding unit 26, and is stored in the data buffer 27 as re-read data 102. As described above, the read out voltage at the time of re-read is determined for each bit value of the upper bit and the lower bit. Since the read-out is performed in page units, read-out using a plurality of read out voltages respectively corresponding to the bit values of the upper bit and the lower bit is performed, instead of changing the read out voltage for each memory cell. Therefore, the read data of the middle page can be obtained for each of the bit values of the upper bit and the lower bit. In FIG. 6, each row of the re-read data 102 illustrates read data having a different read out voltage, and the column on the left side described as U/L illustrates bit values of the upper bit/lower bit corresponding to each read out voltage.

The re-read control unit 28 first sets a bit pointer in bit data 103 in the data buffer 27 to a value indicating a first bit of the ECC group. Then, the re-read control unit 28 selects a bit value of the middle bit from the re-read data 102 based on the bit values of the upper bit and the lower bit of the ECC result data 101 of a bit indicated by the bit pointer, and stores the bit value as estimation data of the bit data 103. The re-read control unit 28 increases the bit indicated by the bit pointer by one bit at a time, and selects a bit value of the middle bit for each bit, and stores the bit value as the estimation data. When having stored the estimation data of the ECC group in the bit data 103, the re-read control unit 28 inputs the estimation data to the decoding unit 26. The decoding unit 26 performs the error correction processing using the input estimation data. Note that storage places of the re-read data 102 and the bit data 103 are not limited to the data buffer 27.

FIG. 7 is a diagram schematically illustrating a method of selecting the estimation data. As described above, read data to be used as the bit value of the middle bit is selected for each bit based on the values of the upper bit and the lower bit for re-read.

Figure 8:
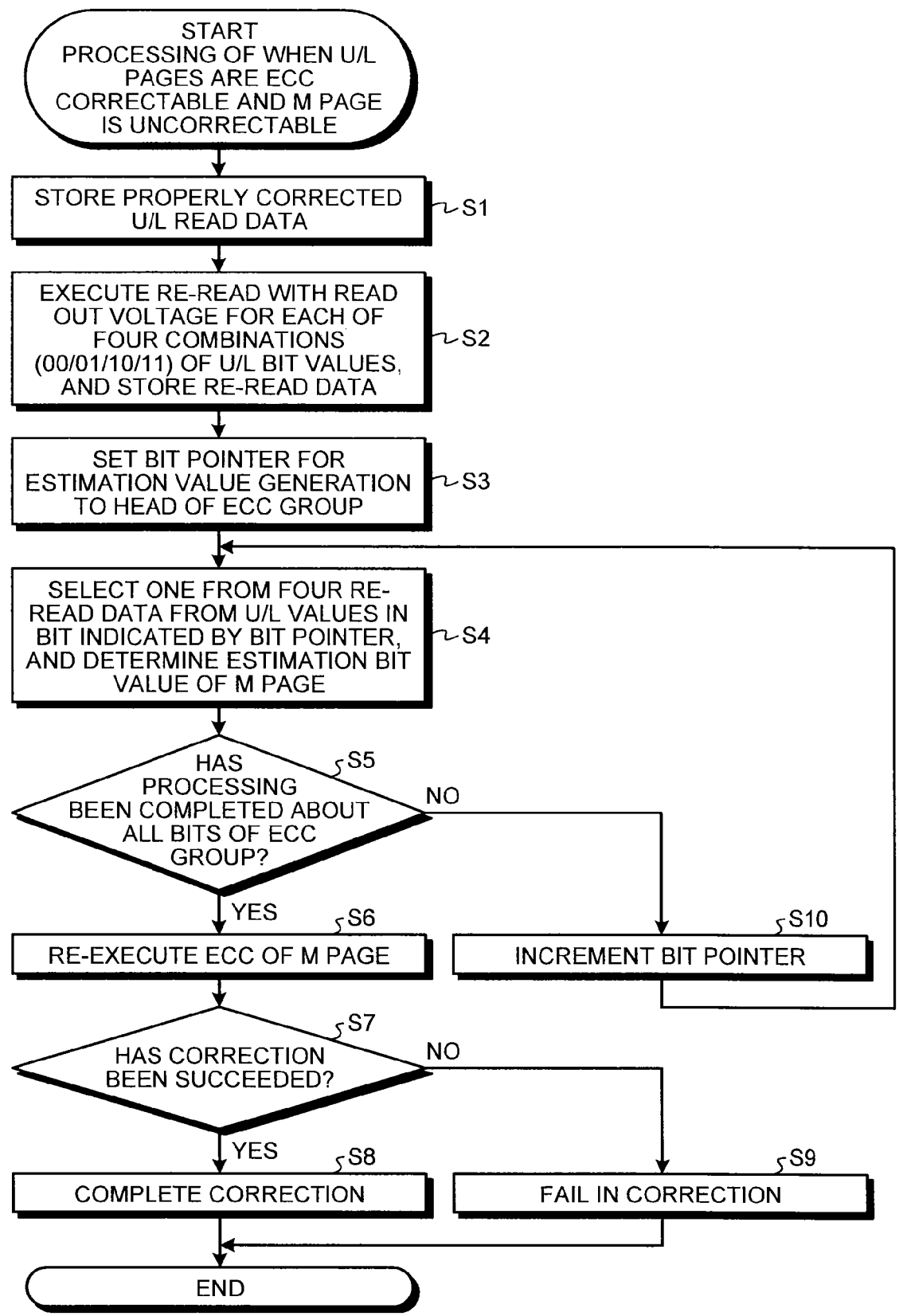
FIG. 8 is a diagram illustrating an example of a re-read procedure of the first embodiment.

FIG. 8 is a diagram illustrating an example of a re-read procedure of the present embodiment. Here, an example in which the middle (M) page was error uncorrectable (ECC uncorrectable), and the upper (U) page and the lower (L) page were error correctable is illustrated. To be specific, a processing example of the next state is illustrated. An ECC group stored in the M becomes error uncorrectable, and the upper page and the lower page corresponding to the ECC group are read out. Then, the error correction is applied to the upper page and the lower page, and as a result, the upper bit and the lower bit corresponding to the ECC group were correctable.

As illustrated in FIG. 8, the re-read control unit 28 stores properly corrected U/L data (the user data and the parity of corresponding ECC groups of the U page and the L page) in the data buffer 27 (step S1). The re-read control unit 28 executes re-read using a read out voltage for estimation of the M page of each of four combinations of the U/L bit values, and stores re-read data (step S2). To be specific, the re-read control unit 28 specifies four read out voltages corresponding to the four combinations ("00", "01", "10", and "11") of the U/L bit values, and instructs the memory I/F 22 to perform read out. The memory I/F 22 outputs four re-read data based on the instruction from the re-read control unit 28. The four re-read data are stored in the data buffer 27.

The read out voltage for re-read for each of the U/L bit values is as follows in the case of the allocation of FIG. 3. When the U/L bit values are 0/0, a proper distribution is the level C or the level D. Therefore, the read out voltage for re-read is set to the boundary between the level C and the level D. When the U/L bit values are 0/1, the proper distribution is the level E or the level F. Therefore, the read out voltage for re-read is set to the boundary between the level E and the level F. When the U/L bit values are 1/0, the proper distribution is the level A or the level B. Therefore, the read out voltage for re-read is set to the boundary between the level A and the level B. When the OIL bit values are 1/1, the proper distribution is the level ER or the level G. Therefore, the read out voltage for re-read may be set to any boundary. For example, the read out voltage is set to the boundary between the level C and the level D.

The re-read control unit 28 sets the bit pointer to a value indicating a head of the ECC group (step S3). The re-read control unit 28 selects, in the bit indicated by the bit pointer, one from the four re-read data based on the U/L bit values, determines the estimation bit value for the M page, and stores the estimation bit value in the data buffer 27 as the estimation data (step S4).

The re-read control unit 28 determines whether the processing of step S4 has been completed about all of the bits of the ECC group (step S5). When the processing of step S4 has been completed about all of the bits of the ECC group (Yes in step S5), the decoding unit 26 executes the error correction processing (ECC) using the estimation data of the M page (step S6). The re-read control unit 28 determines whether the error correction processing of step S6 has been succeeded (step S7), and when succeeded (Yes in step S7), the re-read control unit 28 determines the correction has been succeeded (step S8), and terminates the processing. When the correction has been succeeded, corrected estimation data is output to the host 4 as data after error correction of the M page.

When the error correction processing of step S6 has been failed (No in step S7), the re-read control unit 28 determines the correction has been failed (step S9), and terminates the processing. Subsequent processing of when the correction has been failed is not especially limited. For example, the fact that the correction has been failed is notified to the host 4.

In step S5, when the processing of step S4 has not been completed about all of the bits of the ECC group (No in step S5), the re-read control unit 28 increments the bit pointer by one bit (step S10), and proceeds to step S4.

In the above example, a case in which the middle page is error uncorrectable, and the upper page and the lower page are correctable has been described. However, the possibility of correcting errors can be enhanced by similarly performing re-read using data after error correction of a page that was correctable when the upper page is error uncorrectable, and the middle page and the lower page are correctable, or when the lower page is error uncorrectable, and the upper page and the middle page are correctable.

Further, when one of the U/M/L pages was correctable, and two other pages were uncorrectable, narrowing down from the eight distributions to four distributions is possible by using the data after error correction of the correctable page. In this case, while the possibility of correcting errors is decreased, compared with a case where the correctable pages are two pages, the possibility of correcting errors can be enhanced by performing re-read in a similar procedure.

Further, in the present embodiment, the description has been given using a memory cell of 3 bits/cell as an example. However, the possibility of correcting errors can be enhanced by determining a read out voltage for re-read and performing the re-read, using data after error correction of a correctable page in a similar manner, with respect to a memory cell of 2 bits/cell or a memory cell that can store 4 bits or more in a single memory cell.

Further, when the U/L bit values are used, the eight levels can be narrowed down to two levels (threshold distributions). However, the read out voltage determined according to the U/L bit values may be an intermediate value of these two levels (a midpoint of a center of the distribution and a center of the distribution), or may be a voltage biased to one of the two levels. For example, when inclination of change of the threshold can be estimated in advance, the read out voltage for re-read may be determined in consideration of the estimated direction. For example, when the U/L bit values are 1/1, the levels can be narrowed down to two distribution levels ER/G. In this case, the read out voltage at the boundary between the level C and the level D, which is the center of these distributions, may be used, a read out voltage at the boundary between the level D and the level E may be used by being biased toward a higher side of voltage, or a read out voltage at the boundary between the level B and the level C may be used by being biased toward a lower side of voltage.

For example, when a probability distribution of the change of the threshold is statistically obtained, the read out voltage for re-read may be determined such that two areas of the probability distribution divided using the read out voltage for re-read as the border become equal. Further, instead of using the statistical technique, a method of selecting a more probable value between two values that can be taken, using physical properties of the semiconductor memory 3 as a NAND memory, may be employed. For example, assume that the threshold is changed into a direction in which the voltage rises immediately after write-in (program), rather than a proper threshold, and afterward, there is tendency that the voltage of the threshold is decreased as the lapse of time. By use of the property, immediately after the write-in (until a predetermined first period has elapsed from the write-in), the read out voltage at a lower side of voltage is used. For example, when the U/L bit values are 1/1, the read out voltage at the boundary between the level A and level B is used immediately after the write-in. Then, as the lapse of time, the read out voltage to be selected is shifted to a higher-voltage side. For example, after the lapse of the first period until a predetermined second period, the read out voltage at the boundary between the level C and the level D is used. Then, after the lapse of the second period, the read out voltage at the boundary between the level D and the level E is used.

As described above, in the present embodiment, when a memory cell of 3 bits/cell is used, data of a page that was error uncorrectable among the U/M/L pages is re-read with a read out voltage determined based on data after error correction of a page that was error correctable. Therefore, the possibility of correcting errors can be enhanced.

Second Embodiment

Next, a second embodiment will be described. A configuration of a storage device 1 of the present embodiment is similar to that of the first embodiment. Hereinafter, overlapping description of parts similar to the first embodiment is omitted, and parts different from the first embodiment will be described.

In the first embodiment, a method of narrowing down the levels (threshold distributions) using a bit value after error correction of a page that was error correctable, and selecting a read out voltage and determining a bit value of a page that was error uncorrectable has been described. In the present embodiment, narrowing down of levels using a bit value after error correction of a page that was error correctable is similar to the first embodiment. In the present embodiment, in re-read, to which level a threshold for each memory cell corresponds is obtained by performing read-out with all of the read out voltages that divide respective levels. In the example illustrated in FIG. 3, read-out is performed with all of the seven read out voltages that divide respective levels. Accordingly, to which level of the eight levels of FIG. 3 a threshold for each memory cell corresponds can be observed.

Then, for example, data of a page that was error correctable is obtained by any of the following methods (1), (2), and (3), using a level observed for each memory cell.

(1) A Method of Selecting a Level Close to Observed Distribution

Between the levels narrowed down using the bit value after error correction of the page that was error correctable, a level closer to the level observed by re-read is selected. Then, the bit value of the page that was error uncorrectable is determined to be a bit value corresponding to the selected level. For example, assume that, when the allocation of FIG. 3 is performed, the U/L pages are error correctable, and the M page is error uncorrectable. When the U/L bit values are 1/1, the levels can be narrowed down to two levels of the distribution levels ERG by the U/L bit values. Then, assume that the level observed by re-read is the level E. In this case, since the level E is closer to the level G than to the level ER, the level G is selected, and the bit value of the middle bit is determined to be "0".

(2) A Method of Selecting a Level Using a Probability Obtained in Advance

Probabilities that narrowed levels are proper levels of when a level is observed are obtained in advance, for each level. This probability is obtained for each combination of levels narrowed down based on U/L bit values. For example, in the case of the data allocation illustrated in FIG. 2, the levels are narrowed down to two levels by the U/L bit values, as described in the first embodiment. When the U/L bit values are 0/0, the levels are narrowed down to the distribution levels CD. Therefore, a probability that the proper level is the level C and a probability that the proper level is the level D of when the level A was observed and the U/L bit values were 0/0 are obtained based on a ratio of a frequency of being observed as the level A when write-in was performed as the level C, and a frequency of being observed as the level A when write-in was performed as the level D. Similarly, a probability that the proper level is the level C when the level observed in re-read was the level B is obtained based on a ratio of a frequency of being observed as the level B when write-in was performed as the level C, and a frequency of being observed as the level B when write-in was performed as the level D. Hereinafter, similarly, the probabilities of the level C and the level D are obtained for each observed distribution, in advance. Similarly, when the U/L bit values are 0/1, 1/0, and 1/1, probabilities of narrowed levels are obtained for each observed level, in advance.

For example, assume that the level E was observed from among the eight levels illustrated in FIG. 2. That is, Yi=E where Yi is identification information indicating an observed level. Assume that a probability that the level of when being stored in the memory cell is the level C is obtained, in advance, as described above. That is, a probability P (Xi=C|Yi=E) of Xi=C in the condition of Yi=E is obtained in advance, where Xi is identification information indicating a stored level. Similarly, P (Xi=D|Yi=E) is obtained. In this case, when the level has been narrowed down to the level C or level D from a bit of another page that was error correctable, a distribution having a higher probability is selected from between the level C and the level D, and the bit value of the page where an error correction was not possible is determined to be a bit value corresponding to the selected distribution.

For example, assume that, when the U/L pages were error correctable, and the M page was error uncorrectable in the example of the data allocation of FIG. 2, the level of the memory cell in which the U/L bit values are 0/0 was observed to be the level E. In this case, the level can be narrowed down to the distribution levels CD from the U/L bit values, and a distribution having a higher probability is selected from between the P (Xi=C|Yi=E) and the P (Xi=D|Yi=E), which are obtained in advance. When the P (Xi=C|Yi=E) is higher than the P (Xi=D|Yi=E) in the probability, the level C is selected, and the bit value of the middle bit is determined to be "0" corresponding to the level C.

(3) A Method of Calculating a Likelihood Using a Probability Obtained in Advance, and Estimating a Bit Value Obtaining probabilities of stored (proper) levels of when a level is observed in advance, for each level, is similar to the above (2). Then, a bit value of the page that was error uncorrectable is obtained by obtaining a likelihood of the bit using a ratio of the probabilities, and applying error correction decoding using the likelihood as an input. In this case, a decoding unit 26 is configured such that the error correction decoding using the likelihood as an input can be performed. For example, LDPC encoding is performed in advance, an LDPC code word is obtained in advance in normal error correction, and the decoding unit 26 may perform LDPC decoding. The method is not limited to the above example. The decoding may be performed by a decoding method without using the likelihood in normal decoding, and by a decoding method using the likelihood in the case of re-read.

Figure 9:
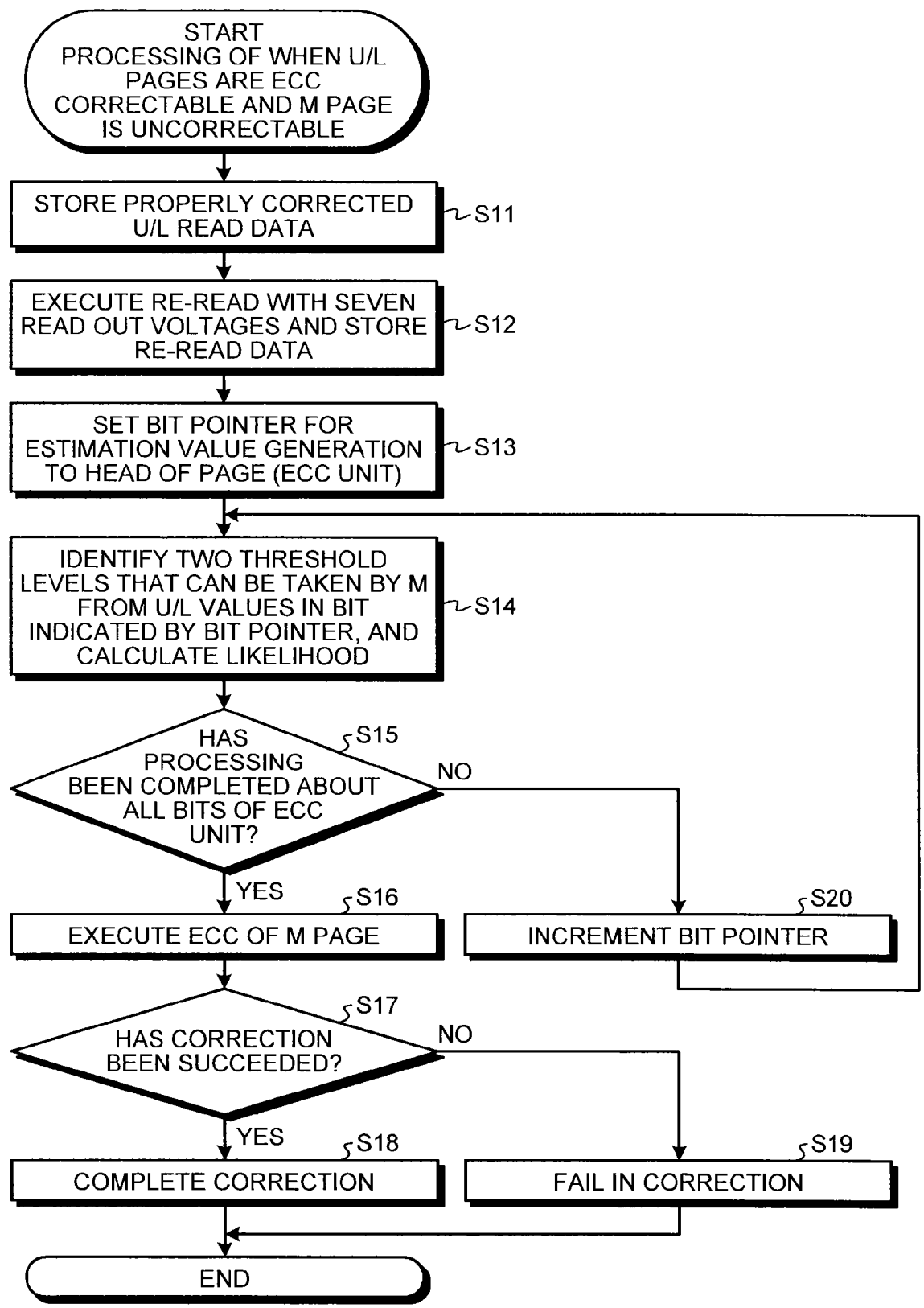
FIG. 9 is a diagram illustrating an example of a re-read procedure of a second embodiment.

FIG. 9 is a diagram illustrating an example of a re-read procedure of the present embodiment. Here, similarly to the example of FIG. 8 of the first embodiment, an example in which a middle (M) page was error uncorrectable (ECC uncorrectable), and an upper (U) page and a lower (L) page were error correctable is illustrated. Note that FIG. 9 illustrates an example of employing the method of the above (3).

Similarly to step S1 of the first embodiment, step S11 of FIG. 9 is conducted. Next, re-read is performed using seven read out voltages (step S12). To be specific, a re-read control unit 28 instructs a memory I/F 22 to perform re-read using the seven read out voltages. Then, the memory I/F 22 performs read-out with the seven read out voltages based on an instruction, and stores read-out results in a data buffer 27. Seven re-read data respectively corresponding to the seven read out voltages are stored.

The re-read control unit 28 sets a bit pointer to a value indicating a head of an ECC group (step S13). Then, the re-read control unit 28 calculates a likelihood about a bit indicated by the bit pointer, using the level observed and obtained from the seven re-read data, and bit values of the U/L pages after error correction (step S14).

Figure 10:
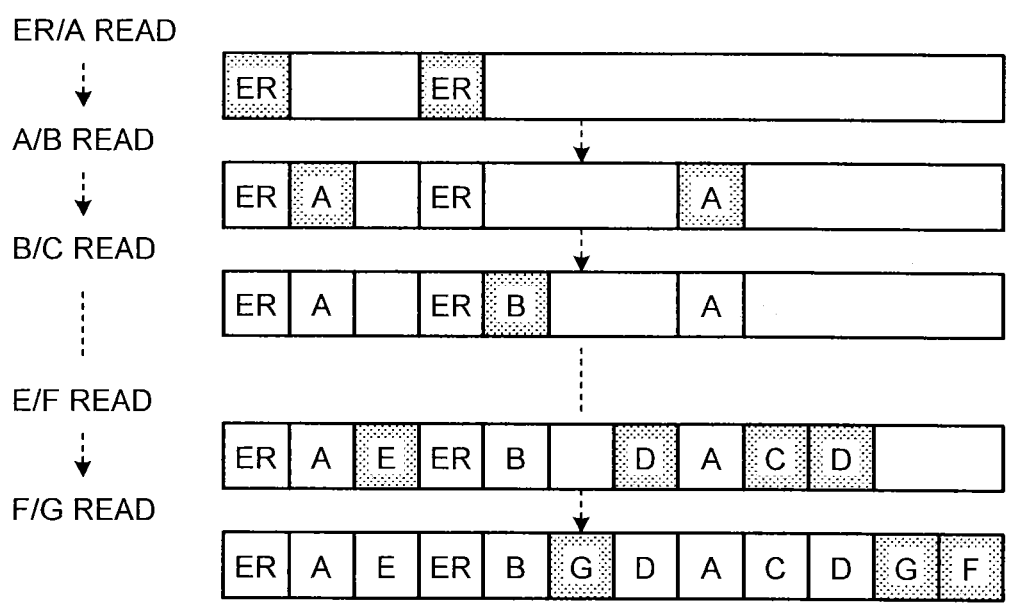
FIG. 10 is a diagram illustrating an example of obtaining an observed level from seven re-read data.

FIG. 10 is a diagram illustrating an example of obtaining an observed level from seven re-read data. A/B read of FIG. 10 indicates read-out is performed with the read out voltage at the boundary between the level A and the level B of FIG. 2. Similarly, seven re-read data re-read with the read out voltages at the boundaries of adjacent distributions are obtained. First, in the ER/A read in the top row, re-read is performed with the lowest read out voltage among seven read out voltages, and thus a distribution where a bit (memory cell) indicating the threshold voltage is the read out voltage or less has been observed is determined to be the level ER, based on a read-out result of the read out voltage (whether the threshold voltage is the read out voltage or less). Next, in the A/B read, among undetermined bits (memory cells), a distribution where a memory cell indicating the threshold voltage is the read out voltage or less has been observed is determined to be the level A. The above process is repeated, and when the seven re-read data is used, as illustrated in the bottom row, observed distributions can be confirmed about all of the bits (memory cell).

Referring back to FIG. 9, the re-read control unit 28 determines whether the processing of step S14 has been completed about all of the bits of the ECC group (step S15). When the processing of step S14 has been completed about all of the bits of the ECC group (Yes in step S15), the decoding unit 26 executes the error correction processing (ECC) using the likelihood of the ECC group (step S16). Steps S17 to S20 are similar to steps S7 to S10 of the first embodiment.

When the above-described methods (1) and (2) are employed, the bit value of the page that was error correctable is determined by the respective procedures, instead of obtaining the likelihood in step S14. Then, in step S16, in place of the likelihood, the error correction processing is performed using the bit value determined in step S14.

As described above, in the present embodiment, in re-read, reading out is performed using all of the read out voltages for distinguishing the levels, and a level for each memory cell is obtained. Then, a bit value of a page that was error uncorrectable is obtained based on the obtained level and data after error correction of a page that was error correctable. Therefore, the possibility of correcting errors can be enhanced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a semiconductor memory including one or more word lines and one or more memory cells, and configured to store a first code word and a second code word, the memory cells being capable of respectively storing a plurality of bits, and a plurality of the memory cells being connected to one word line being capable of storing a plurality of pages; and
a controller configured to read out the first code word from one page among the plurality of pages of the semiconductor memory, and the second code word written in a page other than the page corresponding to the first code word among the plurality of pages, wherein
the controller
performs error correction processing using the first and the second code word read out from the semiconductor memory,
re-reads the first code word when the first code word has not been able to be corrected, and the second code word has been able to be corrected, by the error correction processing, and
determines each bit value of the first code word using a read-out result by the re-reading, and a bit value of each bit of the second code word after error correction.

2. The storage device of claim 1, wherein the controller determines a read out voltage for re-reading the first code word using the bit value of each bit of the second code word after error correction, and performs the re-reading using the determined read out voltage.

3. The storage device of claim 1, wherein, when n is an integer of 2 or more, the memory cell is capable of storing n bits, a threshold voltage of the memory cell is classified into $2^n$ voltage ranges, the $2^n$ voltage ranges respectively correspond to $2^n$ data values, and $2^n-1$ read out voltages are used for identifying which of the $2^n$ voltage ranges belongs to the threshold voltage of the memory cell,
the controller re-reads the first code word using the $2^n-1$ read out voltages.

4. The storage device of claim 3, wherein the controller obtains candidates of the voltage ranges to which the threshold voltage of the memory cell in which the second code word is stored belongs, for each bit value of each bit of the second code word after error correction,
obtains the voltage range to which the threshold voltage of the memory cell belongs as an observation voltage range, for each memory cell, based on the read-out result by the re-reading,
selects a candidate closer to the observation voltage range among the candidates, as the voltage range to which the threshold voltage of the memory cell belongs, and
determines a bit value of the first code word based on the selected voltage range.

5. The storage device of claim 3, wherein the controller obtains candidates of the voltage ranges to which the threshold voltage of the memory cell in which the second code word is stored belongs, for each bit value of each bit of the second code word after error correction, in advance,
obtains, about the voltage ranges that are the candidates of each bit value of each bit of the second code word after error correction, probabilities that the voltage ranges are voltage ranges of at a time of write-in of the memory cell, of when the threshold voltage of the memory cell is observed to belong to a voltage range, for each voltage range, in advance, and
determines each bit value of the first code word based on the read-out result by the re-reading and the probabilities.

6. The storage device of claim 3, wherein the controller obtains candidates of the voltage ranges to which the threshold voltage of the memory cell in which the second code word is stored belongs, for each bit value of each bit of the second code word after error correction, in advance,
obtains, about the voltage ranges that are the candidates of each bit value of each bit of the second code word after error correction, probabilities that the voltage ranges are voltage ranges of at a time of write-in of the memory cell, of when the threshold voltage of the memory cell is observed to belong to a voltage range, for each voltage range, in advance, and
obtains likelihood of each bit of the first code word based on the read-out result by the re-reading and the probabilities, and
performs error correction processing using the likelihood and determines each bit value of the first code word.

7. A memory controller controlling a semiconductor memory including one or more word lines and one or more memory cells, and configured to store a first code word and a second code word, the memory cells being capable of respectively storing a plurality of bits, and a plurality of the memory cells being connected to one word line being configured to store a plurality of pages, wherein
the controller reads out the first code word from one page among the plurality of pages of the semiconductor memory, and the second code word written in a page other than the page corresponding to the first code word among the plurality of pages,
performs error correction processing using the first and the second code word read out from the semiconductor memory,
re-reads the first code word when the first code word has not been able to be corrected, and the second code word has been able to be corrected, by the error correction processing, and
determines each bit value of the first code word using a read-out result by the re-reading, and a bit value of each bit of the second code word after error correction.

8. The memory controller of claim 7, configured to determine a read out voltage for re-reading the first code word using the bit value of each bit of the second code word after error correction, and to perform the re-reading using the determined read out voltage.

9. The memory controller of claim 7, wherein, when n is an integer of 2 or more, the memory cell is capable of storing n bits, a threshold voltage of the memory cell is classified into $2^n$ voltage ranges, the $2^n$ voltage ranges respectively correspond to $2^n$ data values, and $2^n-1$ read out voltages are used for identifying which of the $2^n$ voltage ranges belongs to the threshold voltage of the memory cell,
the first code word is re-read using the $2^n-1$ read out voltages.

10. The memory controller of claim 9, configured to obtain candidates of the voltage ranges to which the threshold voltage of the memory cell in which the second code word is stored belongs, for each bit value of each bit of the second code word after error correction,
to obtain the voltage range to which the threshold voltage of the memory cell belongs as an observation voltage range, for each memory cell, based on the read-out result by the re-reading, to select a candidate closer to the observation voltage range among the candidates, as the voltage range to which the threshold voltage of the memory cell belongs, and to determine a bit value of the first code word based on the selected voltage range.

11. The memory controller of claim 9, configured to obtain candidates of the voltage ranges to which the threshold voltage of the memory cell in which the second code word is stored belongs, for each bit value of each bit of the second code word after error correction, in advance, to obtain, about the voltage ranges that are the candidates of each bit value of each bit of the second code word after error correction, probabilities that the voltage ranges are voltage ranges of at a time of write-in of the memory cell, of when the threshold voltage of the memory cell is observed to belong to a voltage range, for each voltage range, in advance, and to determine each bit value of the first code word based on the read-out result by the re-reading and the probabilities.

12. The memory controller of claim 9, configured to obtain candidates of the voltage ranges to which the threshold voltage of the memory cell in which the second code word is stored belongs, for each bit value of each bit of the second code word after error correction, in advance, to obtain, about the voltage ranges that are the candidates of each bit value of each bit of the second code word after error correction, probabilities that the voltage ranges are voltage ranges of at a time of write-in of the memory cell, of when the threshold voltage of the memory cell is observed to belong to a voltage range, for each voltage range, in advance, to obtain likelihood of each bit of the first code word based on the read-out result by the re-reading and the probabilities, and to perform error correction processing using the likelihood and determines each bit value of the first code word.

13. A memory control method of controlling a semiconductor memory including one or more word lines and one or more memory cells, the memory cells being capable of respectively storing a plurality of bits, and a plurality of the memory cells being connected to one word line being configured to store a plurality of pages, the method comprising:

writing a first code word in a first page that is one of the plurality of pages of the semiconductor memory, and a second code word in a second page other than the first page of the plurality of pages of the semiconductor memory;

reading out the first code word from the first page of the semiconductor memory, and the second code word from the second page of the semiconductor memory;

performing error correction processing using the first and the second code word read out from the semiconductor memory;

re-reading the first code word when the first code word has not been able to be corrected, and the second code word has been able to be corrected, by the error correction processing; and determining each bit value of the first code word using a read-out result by the re-reading, and a bit value of each bit of the second code word after error correction.

14. The memory control method of claim 13, comprising determining a read out voltage for re-reading the first code word using the bit value of each bit of the second code word after error correction, and performing the re-reading using the determined read out voltage.

15. The memory control method of claim 13, wherein, when n is an integer of 2 or more, the memory cell is capable of storing n bits, a threshold voltage of the memory cell is classified into $2^n$ voltage ranges, the $2^n$ voltage ranges respectively correspond to $2^n$ data values, and $2^n-1$ read out voltages are used for identifying which of the $2^n$ voltage ranges belongs to the threshold voltage of the memory cell, the first code word is re-read using the $2^n-1$ read out voltages.

16. The memory control method of claim 15, comprising
obtaining candidates of the voltage ranges to which the threshold voltage of the memory cell in which the second code word is stored belongs, for each bit value of each bit of the second code word after error correction, obtaining the voltage range to which the threshold voltage of the memory cell belongs as an observation voltage range, for each memory cell, based on the read-out result by the re-reading, selecting a candidate closer to the observation voltage range among the candidates, as the voltage range to which the threshold voltage of the memory cell belongs, and determining a bit value of the first code word based on the selected voltage range.

17. The memory control method of claim 15, comprising
obtaining candidates of the voltage ranges to which the threshold voltage of the memory cell in which the second code word is stored belongs, for each bit value of each bit of the second code word after error correction, in advance, obtaining, about the voltage ranges that are the candidates of each bit value of each bit of the second code word after error correction, probabilities that the voltage ranges are voltage ranges of at a time of write-in of the memory cell, of when the threshold voltage of the memory cell is observed to belong to a voltage range, for each voltage range, in advance, and determining each bit value of the first code word based on the read-out result by the re-reading and the probabilities.

18. The memory control method of claim 15, comprising
obtaining candidates of the voltage ranges to which the threshold voltage of the memory cell in which the second code word is stored belongs, for each bit value of each bit of the second code word after error correction, in advance, obtaining, about the voltage ranges that are the candidates of each bit value of each bit of the second code word after error correction, probabilities that the voltage ranges are voltage ranges of at a time of write-in of the memory cell, of when the threshold voltage of the memory cell is observed to belong to a voltage range, for each voltage range, in advance, and obtaining likelihood of each bit of the first code word based on the read-out result by the re-reading and the probabilities, and performing error correction processing using the likelihood and determines each bit value of the first code word.

* * * * *